(12) United States Patent
Shimizu et al.

(10) Patent No.: US 10,983,544 B2
(45) Date of Patent: Apr. 20, 2021

(54) OUTPUT CIRCUIT

(71) Applicant: SOCIONEXT INC., Kanagawa (JP)

(72) Inventors: Kyota Shimizu, Yokohama (JP);
Toshiya Suzuki, Yokohama (JP);
Tomohiko Koto, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/600,123

(22) Filed: Oct. 11, 2019

(65) Prior Publication Data
US 2020/0042029 A1 Feb. 6, 2020

Related U.S. Application Data

(63) Continuation of application No. PCT/JP2018/007794, filed on Mar. 1, 2018.

(30) Foreign Application Priority Data

Apr. 18, 2017 (JP) .............................. JP2017-081981

(51) Int. Cl.
*G05F 1/618* (2006.01)
*G11C 7/10* (2006.01)
(Continued)

(52) U.S. Cl.
CPC ............ *G05F 1/618* (2013.01); *G11C 7/1057* (2013.01); *H03K 3/281* (2013.01);
(Continued)

(58) Field of Classification Search
CPC ......... G05F 1/46; G05F 1/618; G11C 7/1051; G11C 7/1057; H03K 3/26; H03K 3/28;
(Continued)

(56) References Cited

U.S. PATENT DOCUMENTS

| | | |
|---|---|---|
| 2001/0054886 A1 | 12/2001 | Takahashi et al. |
| 2013/0141140 A1 | 6/2013 | Kumar |
| 2014/0292379 A1 | 10/2014 | Itonaga |

FOREIGN PATENT DOCUMENTS

| | | |
|---|---|---|
| JP | H08-287682 A | 11/1996 |
| JP | 2002-9608 A | 1/2002 |
| JP | 2014-209715 A | 11/2014 |

OTHER PUBLICATIONS

International Search Report issued in corresponding International Patent Application No. PCT/JP2018/007794, dated May 22, 2018, with partial translation.

(Continued)

*Primary Examiner* — Diana J. Cheng
(74) *Attorney, Agent, or Firm* — McDermott Will & Emery LLP (57) ABSTRACT

An output circuit includes: a first p-type transistor having a source connected to VDDH and a gate to which an input signal is fed; and a second p-type transistor having a source connected to the drain of the first p-type transistor, a drain connected to an output terminal, and a gate connected to a first node. A capacitor has one terminal to which the input signal is fed and the other terminal connected to the first node. A first n-type transistor has a source connected to VDDL, a drain connected to the first node, and a gate to which a signal corresponding to the input signal is fed. A second n-type transistor has a source and a gate both connected to VDDL and a drain connected to the first node.

4 Claims, 10 Drawing Sheets

(51) Int. Cl.
*H03K 3/281* (2006.01)
*H03K 3/356* (2006.01)
*H03K 19/00* (2006.01)
*H03K 19/003* (2006.01)
*H03K 19/0175* (2006.01)

(52) U.S. Cl.
CPC ... *H03K 3/356113* (2013.01); *H03K 19/0013* (2013.01); *H03K 19/00361* (2013.01); *H03K 19/0175* (2013.01)

(58) Field of Classification Search
CPC ...... H03K 3/281; H03K 3/286; H03K 3/2865; H03K 3/288; H03K 3/2885; H03K 3/289; H03K 3/2893; H03K 3/2897; H03K 3/29; H03K 3/353; H03K 3/356; H03K 3/356104; H03K 3/356113; H03K 3/356121; H03K 3/35613; H03K 3/356139; H03K 3/356156; H03K 3/356182; H03K 3/356191; H03K 19/0008; H03K 19/0013; H03K 19/003; H03K 19/00346; H03K 19/00361; H03K 19/0175
USPC .................................................. 327/108–112
See application file for complete search history.

(56) References Cited

OTHER PUBLICATIONS

Written Opinion issued in corresponding International Patent Application No. PCT/JP2018/007794, dated May 22, 2018, with partial translation.

OUTPUT CIRCUIT

CROSS-REFERENCE TO RELATED APPLICATIONS

This is a continuation of International Application No. PCT/JP2018/007794 filed on Mar. 1, 2018, which claims priority to Japanese Patent Application No. 2017-081981 filed on Apr. 18, 2017. The entire disclosures of these applications are incorporated by reference herein.

BACKGROUND

The present disclosure relates to an output circuit used for a semiconductor integrated circuit device.

As semiconductor integrated circuit devices become finer and finer, the withstand voltage of their transistors is increasingly lowered: for example, transistors having a withstand voltage as low as 1.8 V are used as IO transistors for use in interface circuits that input/output signals from/to the outside. Such interface circuits are however sometimes required to have a configuration capable of inputting/outputting a signal having a voltage as high as 3.3 V, for example, depending on the specifications thereof and the like.

Japanese Unexamined Patent Publication No. 2002-9608 (FIGS. 1 and 2) (Patent Document 1) discloses a technology of configuring an output circuit that outputs a high-voltage signal outside using transistors that operate at low voltage. For example, in the circuit configuration in FIG. 1, cascaded p-type transistors 1 and 2 are placed between a high-voltage power supply and an output terminal, and cascaded n-type transistors 3 and 4 are placed between a ground power supply and the output terminal. A capacitor CP is provided between the gates of the p-type transistors 1 and 2, and a capacitor CN is provided between the gates of the n-type transistors 3 and 4.

Having the above circuit configuration, when an output signal Dout makes a transition to high level, rising of the gate potential RP of the p-type transistor 2 is curbed due to the coupling by the capacitor CP, whereby the rise of the output signal Dout is hastened. With this, rising of the drain-source voltage of the p-type transistor 2 is curbed. Likewise, when the output signal Dout makes a transition to low level, falling of the gate potential RN of the n-type transistor 3 is curbed due to the coupling by the capacitor CN, whereby the fall of the output signal Dout is hastened. With this, rising of the drain-source voltage of the n-type transistor 3 is curbed.

SUMMARY

In the circuit configuration in Patent Document 1, a potential is supplied from a minute-current power supply to the gates of the p-type transistor 2 and the n-type transistor 3. For this reason, the fall of the gate potential RP of the p-type transistor 2 is great, and recovery of the gate potential RP having fallen once is slow. Likewise, the rise of the gate potential RN of the n-type transistor 3 is great, and recovery of the gate potential RN having risen once is slow. Therefore, there is a possibility that the gate-source voltages of the p-type transistor 2 and the n-type transistor 3 may exceed their withstand voltages. Also, the drain currents of the p-type transistor 2 and the n-type transistor 3 become great. This may result in easy occurrence of degradation or damage of the p-type transistor 2 and the n-type transistor 3.

An objective of the present disclosure is providing an output circuit that outputs an output signal having a larger amplitude in response to a data input signal, in which degradation or damage of transistors can be prevented from occurring.

According to one form of the present disclosure, an output circuit configured to receive a data input signal and output an output signal that makes a transition between a ground potential and a first potential in response to the data input signal includes: an output terminal configured to output the output signal; an input node configured to receive an input signal that changes in response to the data input signal and is smaller in amplitude than the output signal; a first p-type transistor having a source connected to a first power supply that feeds the first potential and a gate to which the input signal is fed; a second p-type transistor having a source connected to a drain of the first p-type transistor, a drain connected to the output terminal, and a gate connected to a first node; a capacitor having one terminal to which the input signal is fed and the other terminal connected to the first node; a first n-type transistor having a source connected to a second power supply that feeds a second potential lower than the first potential and a drain connected to the first node; and a second n-type transistor having a source and a gate both connected to the second power supply and a drain connected to the first node, wherein the first n-type transistor has a gate to which a signal corresponding to the input signal is fed, and is controlled to be ON when the input signal is at high level and OFF for at least a predetermined time period when the input signal makes a first transition that is a transition from high level to low level.

According to the form described above, the first and second p-type transistors are connected in series between the first power supply and the output terminal. The input signal is fed to the gate of the first p-type transistor. The capacitor having one terminal to which the input signal is fed is connected at the other terminal to the first node that is connected to the gate of the second p-type transistor. The first and second n-type transistors are connected between the first node and the second power supply. A signal corresponding to the input signal is fed to the gate of the first n-type transistor, and the gate of the second n-type transistor is connected to the second power supply. When the input signal is at high level, the first n-type transistor is ON, whereby the second potential is fed to the gate of the second p-type transistor. At a transition of the input signal from high level to low level, the first n-type transistor is OFF for at least a predetermined time period, whereby the potential of the first node drops along with the transition of the input signal due to the coupling by the capacitor. This hastens the rise of the output signal. Thereafter, with the clumping function of the second n-type transistor, the potential of the first node swiftly returns. As a result, the gate-source voltage of the second p-type transistor is kept from changing sharply, and thus prevented from exceeding the allowable withstand voltage. Also, rising of the drain-source voltage of the second p-type transistor is curbed, and thus the voltage is prevented from exceeding the allowable withstand voltage. Further, the drain-source current of the second p-type transistor is kept small. In this way, degradation or damage of the second p-type transistor can be prevented from occurring.

According to another form of the present disclosure, an output circuit configured to receive a data input signal and output an output signal that makes a transition between a ground potential and a first potential in response to the data input signal includes: an output terminal configured to output the output signal; an input node configured to receive an input signal that changes in response to the data input signal and is smaller in amplitude than the output signal; a first n-type transistor having a source connected to a ground power supply and a gate to which the input signal is fed; a second n-type transistor having a source connected to a drain of the first n-type transistor, a drain connected to the output terminal, and a gate connected to a first node; a capacitor having one terminal to which the input signal is fed and the other terminal connected to the first node, a first p-type transistor having a source connected to a second power supply that feeds a second potential lower than the first potential and a drain connected to the first node; and a second p-type transistor having a source and a gate both connected to the second power supply and a drain connected to the first node, wherein the first p-type transistor has a gate to which a signal corresponding to the input signal is fed, and is controlled to be ON when the input signal is at low level and OFF for at least a predetermined time period when the input signal makes a first transition that is a transition from low level to high level.

According to the form described above, the first and second n-type transistors are connected in series between the ground power supply and the output terminal. The input signal is fed to the gate of the first n-type transistor. The capacitor having one terminal to which the input signal is fed is connected at the other terminal to the first node that is connected to the gate of the second n-type transistor. The first and second p-type transistors are connected between the first node and the second power supply. A signal corresponding to the input signal is fed to the gate of the first p-type transistor, and the gate of the second p-type transistor is connected to the second power supply. When the input signal is at low level, the first p-type transistor is ON, whereby the second potential is fed to the gate of the second n-type transistor. At a transition of the input signal from low level to high level, the first p-type transistor is OFF for at least a predetermined time period, whereby the potential of the first node rises along with the transition of the input signal due to the coupling by the capacitor. This hastens the fall of the output signal. Thereafter, with the clumping function of the second p-type transistor, the potential of the first node swiftly returns. As a result, the gate-source voltage of the second n-type transistor is kept from changing sharply, and thus prevented from exceeding the allowable withstand voltage. Also, rising of the drain-source voltage of the second n-type transistor is curbed, and thus the voltage is prevented from exceeding the allowable withstand voltage. Further, the drain-source current of the second n-type transistor is kept small. In this way, degradation or damage of the second n-type transistor can be prevented from occurring.

According to the present disclosure, in an output circuit that outputs an output signal having a larger amplitude in response to a data input signal, degradation or damage of transistors can be prevented from occurring.

DETAILED DESCRIPTION

Embodiments of the present disclosure will be described hereinafter with reference to the accompanying drawings. It should be noted that the circuit configuration diagrams to be referred to hereinafter are simplified illustrations focusing on components related to the present disclosure. Therefore, for example, a component illustrated as if directly connected to some component may be connected indirectly with a third component placed therebetween in the actual circuit configuration.

First Embodiment

Figure 1:
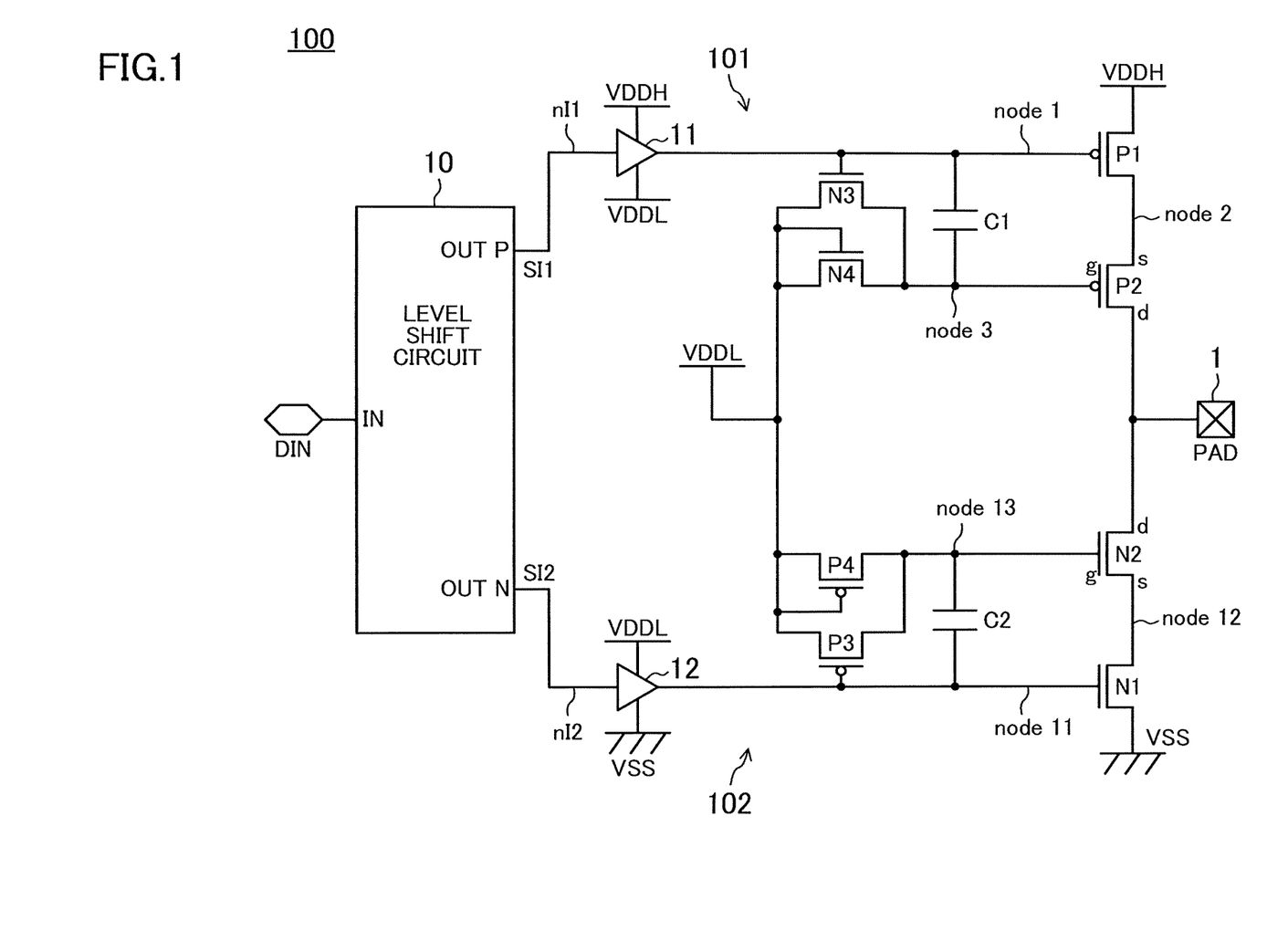
FIG. 1 is a circuit configuration diagram of an output circuit according to the first embodiment.

FIG. 1 is a circuit configuration diagram of an output circuit according to the first embodiment. An output circuit 100 of FIG. 1 receives a data input signal DIN and outputs an output signal PAD that changes in response to the data input signal DIN. The output signal PAD is output from an output terminal 1. The output circuit 100 is provided in a signal output section of an LSI, for example. In this case, an output pad of the LSI is equivalent to the output terminal 1.

The output circuit 100 is connected to a first power supply VDDH and a second power supply VDDL. Note that, as used herein, "VDDH," "VDDL," and "VSS" are used as symbols representing both the power supplies themselves and the potentials fed by the power supplies. The first potential VDDH is 3.3 V, for example, and the second potential VDDL, which is lower than the first potential VDDH, is 1.8 V, for example. The data input signal DIN is a low-amplitude signal and makes a transition in the range of the ground potential VSS to 0.9 V, for example. The output signal PAD makes a transition in the range of the ground potential VSS to the first potential VDDH. Also, as used herein, a "node X" (X is an integer) represents a node in the circuit configuration, and also may be used as the symbol representing the potential of the node.

The output circuit 100 includes a level shift circuit 10, first and second buffer circuits 11 and 12, p-type transistors P1, P2, P3, and P4, n-type transistors N1, N2, N3, and N4, and capacitors C1 and C2. Each of the transistors is assumed to be a metal oxide semiconductor field effect transistor (MOSFET). The level shift circuit 10 receives the low-amplitude data input signal DIN at its input IN, converts the received signal to a signal SU that makes a transition in the range of the second potential VDDL to the first potential VDDH, and outputs the signal SI1 from an output OUT P. The level shift circuit 10 also converts the received signal to a signal SI2 that makes a transition in the range of the ground potential VSS to the second potential VDDL, and outputs the signal SI2 from an output OUT N. The signal SI1 is fed as the input of the first buffer circuit 11, and the signal SI2 is fed as the input of the second buffer circuit 12.

The output circuit 100 includes an H-side drive circuit 101 that is a circuit part for driving the output signal PAD toward high level and an L-side drive circuit 102 that is a circuit part for driving the output signal PAD toward low level. A node nI1 to which the input of the first buffer circuit 11 is connected is equivalent to the input node of the H-side drive circuit 101. Likewise, a node nI2 to which the input of the second buffer circuit 12 is connected is equivalent to the input node of the L-side drive circuit 102. That is, the input signal SI1 is fed to the input node nI1 of the H-side drive circuit 101, and the input signal SI2 is fed to the input node nI2 of the L-side drive circuit 102.

The H-side drive circuit 101 includes the p-type transistors P1 and P2 serially connected between the first power supply VDDH and the output terminal 1. The p-type transistor P1 has a source connected to the first power supply VDDH and a gate connected to a node 1. The node 1 is connected to the input node nI1 via the first buffer circuit 11 and fed with the input signal SI1. The p-type transistor P2 has a source connected to the drain of the p-type transistor P1 (node 2), a drain connected to the output terminal 1, and a gate connected to a node 3. A resistor element may be connected between the drain of the p-type transistor P2 and the output terminal 1.

The H-side drive circuit 101 further includes the capacitor C1 for coupling, the n-type transistor N3 for switching, and the n-type transistor N4 for clamping. The capacitor C1 is connected between the nodes 1 and 3. That is, the capacitor C1 has one terminal to which the input signal SI1 is fed and the other terminal connected to the gate of the p-type transistor P2. The n-type transistor N3 has a source connected to the second power supply VDDL, a drain connected to the node 3, and a gate connected to the node 1. The n-type transistor N4 has a source and a gate both connected to the second power supply VDDL and a drain connected to the node 3.

Likewise, the L-side drive circuit 102 includes the n-type transistors N1 and N2 serially connected between the ground power supply VSS and the output terminal 1. The n-type transistor N1 has a source connected to the ground power supply VSS and a gate connected to a node 11. The node 11 is connected to the input node nI2 via the second buffer circuit 12 and fed with the input signal SI2. The n-type transistor N2 has a source connected to the drain of the n-type transistor N1 (node 12), a drain connected to the output terminal 1, and a gate connected to a node 13. A resistor element may be connected between the drain of the n-type transistor N2 and the output terminal 1.

The L-side drive circuit 101 further includes the capacitor C2 for coupling, the p-type transistor P3 for switching, and the p-type transistor P4 for clamping. The capacitor C2 is connected between the nodes 11 and 13. That is, the capacitor C2 has one terminal to which the input signal SI2 is fed and the other terminal connected to the gate of the n-type transistor N2. The p-type transistor P3 has a source connected to the second power supply VDDL, a drain connected to the node 13, and a gate connected to the node 11. The p-type transistor P4 has a source and a gate both connected to the second power supply VDDL and a drain connected to the node 13.

Figure 2:
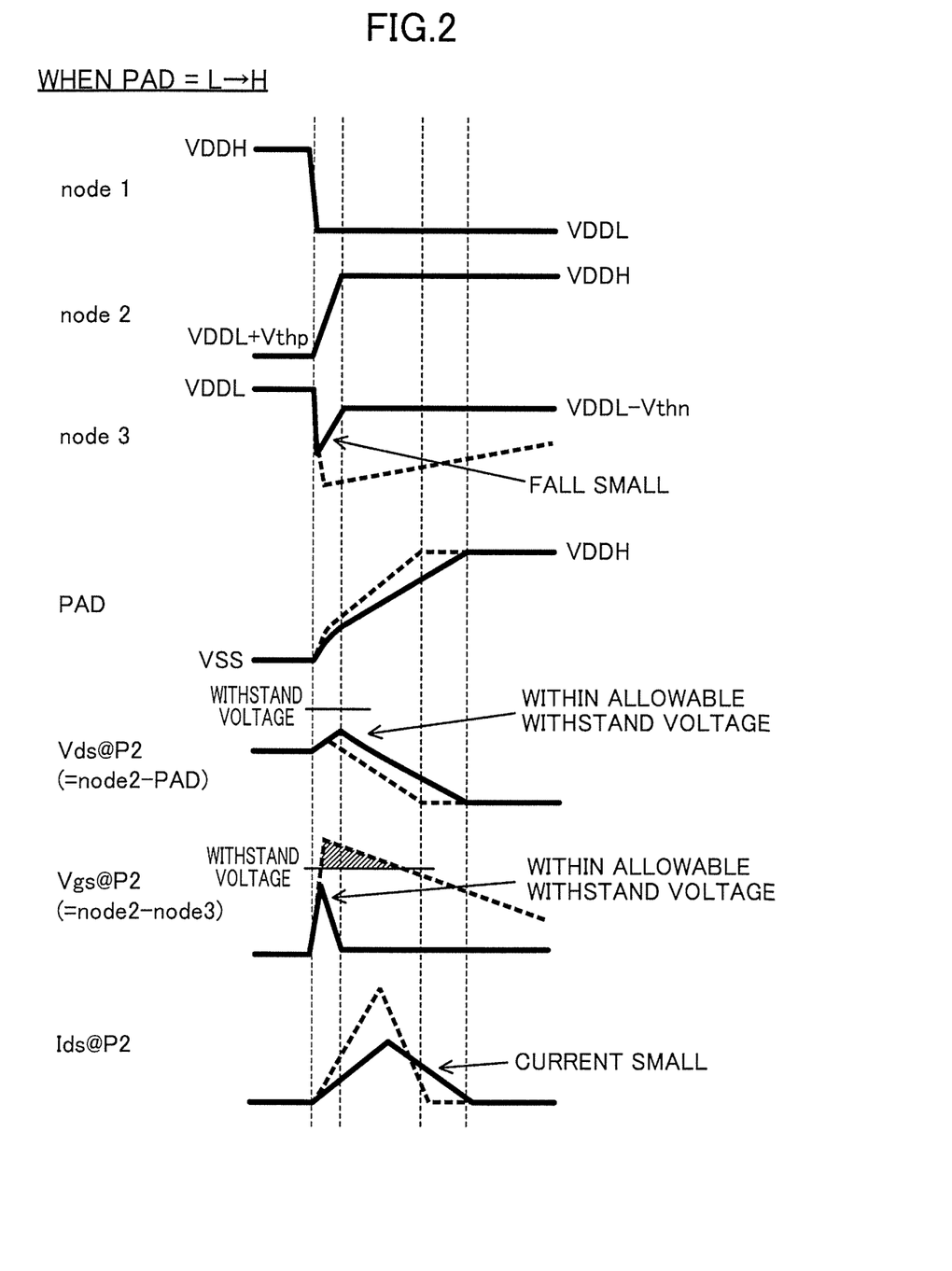
FIG. 2 is a waveform chart showing the operation of the output circuit of FIG. 1.
Figure 3:
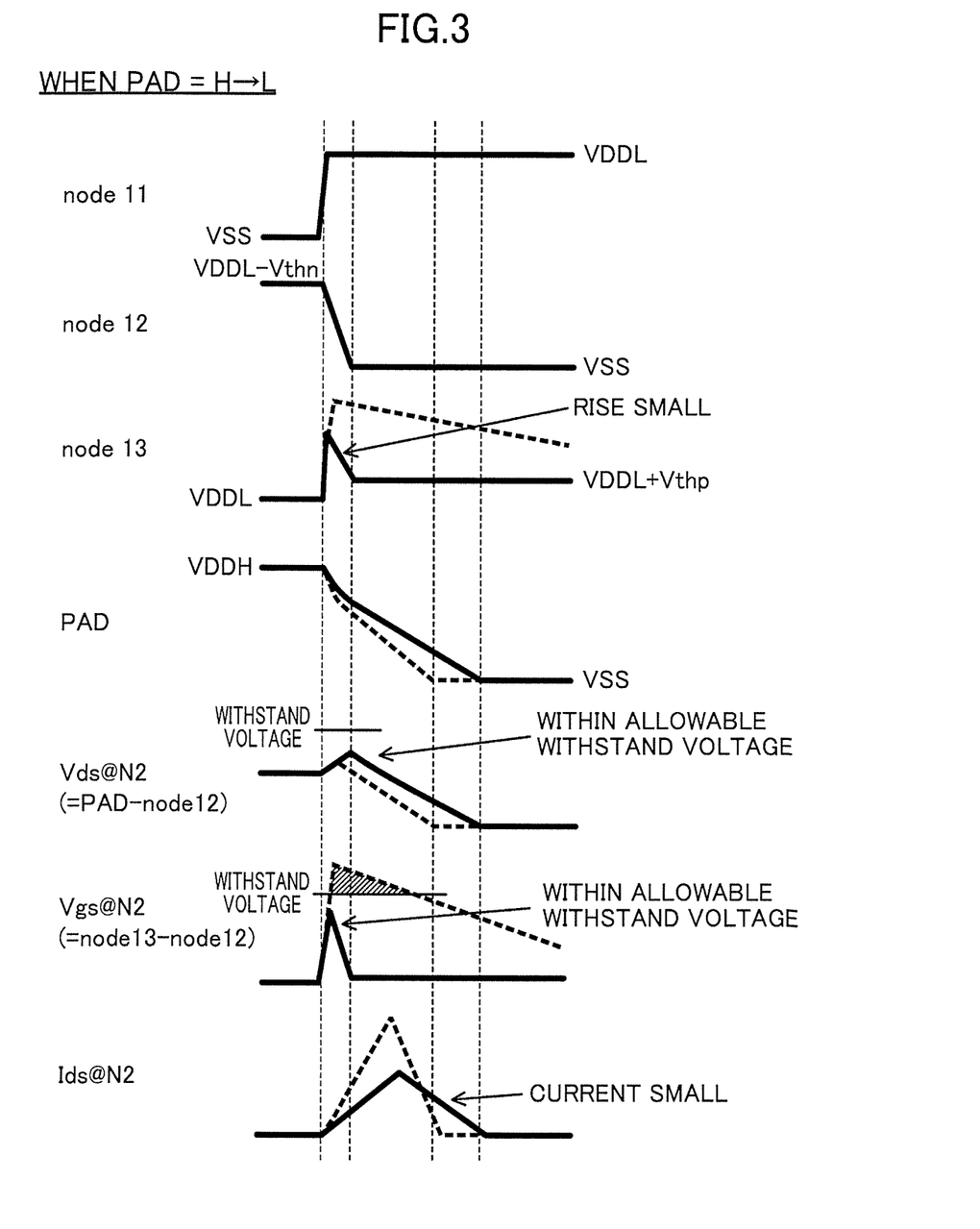
FIG. 3 is a waveform chart showing the operation of the output circuit of FIG. 1.

The operation of the output circuit of FIG. 1 will be described using the waveform charts of FIGS. 2 and 3. FIG. 2 shows the case of a transition of the output signal PAD from low level to high level, and FIG. 3 shows the case of a transition of the output signal PAD from high level to low level. Note that, in FIGS. 2 and 3, the solid lines represent potential changes in this embodiment, and the dashed lines represent potential changes in the conventional circuit configuration (Patent Document 1).

As shown in FIG. 2, when the output signal PAD is at low level (VSS), the potential of the node 1 is at high level (VDDH) (i.e., the input signal SI1 is at high level), and the p-type transistor P1 is OFF (in a nonconductive state). At this time, since the n-type transistor N3 is ON (in a conductive state), the potential of the node 3 is VDDL, and the potential of the node 2 is (VDDL+Vthp). Vthp is a threshold voltage of a p-type transistor.

When the input signal SI1 makes a transition from high level to low level, the signal at the node 1 makes a transition from high level to low level (VDDL). At this time, the p-type transistor P1 becomes ON, whereby the potential of the node 2 makes a transition to VDDH, and the output signal PAD starts making a transition from low level (VSS) to high level (VDDH). Meanwhile, the n-type transistor N3 becomes OFF, whereby the potential of the node 3 is drawn by the signal change at node 1 and drops due to the coupling by the capacitor C1. This hastens the rise of the output signal PAD.

Thereafter, the potential of the node 3 swiftly returns up to (VDDL−Vthn) by the clamping function of the n-type transistor N4. Vthn is a threshold voltage of an n-type transistor. The potential drop at the node 3 is therefore small compared to the conventional case. As a result, the gate-source voltage Vgs of the p-type transistor P2 is kept from changing sharply, and thus prevented from exceeding the allowable withstand voltage. Also, rising of the drain-source voltage Vds of the p-type transistor P2 is curbed, and thus the voltage Vds is prevented from exceeding the allowable withstand voltage. Further, the drain-source current Ids of the p-type transistor P2 is small compared to the conventional case.

Likewise, as shown in FIG. 3, when the output signal PAD is at high level (VDDH), the node 11 is at low level (VSS) (i.e., the input signal SI2 is at low level), and the n-type transistor N1 is OFF. At this time, since the p-type transistor P3 is ON, the potential of the node 13 is VDDL, and the potential of the node 12 is (VDDL−Vthn).

When the input signal SI2 makes a transition from low level to high level, the signal at the node 11 makes a transition from low level to high level (VDDL). At this time, the n-type transistor N1 becomes ON, whereby the potential of the node 12 makes a transition to VSS, and the output signal PAD starts making a transition from high level (VDDH) to low level (VSS). Meanwhile, the p-type transistor P3 becomes OFF, whereby the potential of the node 13 is drawn by the signal change at the node 11 and rises due to the coupling by the capacitor C2. This hastens the fall of the output signal PAD.

Thereafter, the potential of the node 13 swiftly returns down to (VDDL+Vthp) by the clamping function of the p-type transistor P4. The potential rise at the node 13 is therefore small compared to the conventional case. As a result, the gate-source voltage Vgs of the n-type transistor N2 is kept from changing sharply, and thus prevented from exceeding the allowable withstand voltage. Also, rising of the drain-source voltage Vds of the n-type transistor N2 is curbed, and thus the voltage Vds is prevented from exceeding the allowable withstand voltage. Further, the drain-source current Ids of the n-type transistor N2 is small compared to the conventional case.

As described above, according to this embodiment, with the capacitors C1 and C2, the rise and fall of the output signal PAD can be hastened, and also degradation or damage of the p-type transistor P2 and the n-type transistor N2 can be prevented from occurring.

In this embodiment, in the H-side drive circuit 101, the capacitor C1 and the n-type transistors N3 and N4 are connected to the gate of the p-type transistor P2, and in the L-side drive circuit 102, the capacitor C2 and the p-type transistors P3 and P4 are connected to the gate of the N-type transistor N2. Such a configuration may be provided in only one of the H-side drive circuit 101 and the L-side drive circuit 102. For example, while the H-side drive circuit 101 is configured as in FIG. 1, the L-side drive circuit 102 may be provided with neither the capacitor C2 nor the p-type transistor P3 or P4, but configured so that the gate of the n-type transistor N2 be connected to the second power supply VDDL. Otherwise, while the L-side drive circuit 102 is configured as in FIG. 1, the H-side drive circuit 101 may be provided with neither the capacitor C1 nor the n-type transistor N3 or N4, but configured so that the gate of the p-type transistor P2 be connected to the second power supply VDDL.

Second Embodiment

Figure 4:
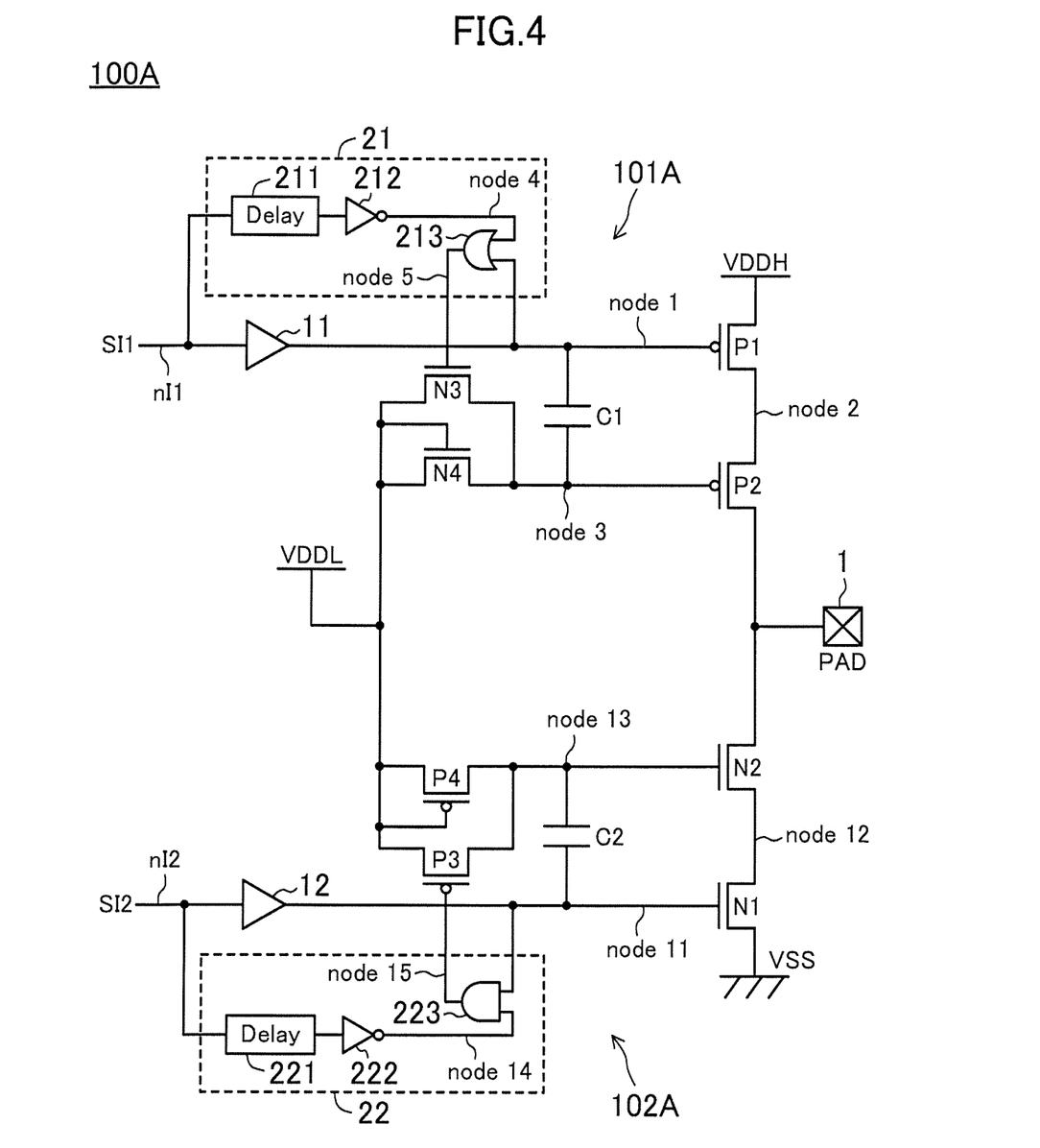
FIG. 4 is a circuit configuration diagram of an output circuit according to the second embodiment.

FIG. 4 is a circuit configuration diagram of an output circuit according to the second embodiment. An output circuit 100A of FIG. 4 has a configuration roughly similar to that of the output circuit 100 of FIG. 1, and thus detailed description on the components already described is omitted here. Note that, in FIG. 4, the level shift circuit 10 and its preceding configuration are omitted. This also applies to the circuit configuration diagrams to follow.

In the first embodiment, the gate of the n-type transistor N3 is connected to the gate of the p-type transistor P1, and the input signal SI1 is fed to the gates. Likewise, the gate of the p-type transistor P3 is connected to the gate of the n-type transistor N1, and the input signal SI2 is fed to the gates. In this embodiment, a signal corresponding to the input signal SI1 is fed to the gate of the n-type transistor N3, and a signal corresponding to the input signal SI2 is fed to the gate of the p-type transistor P3.

In the output circuit 100A of FIG. 4, an H-side drive circuit 101A includes a pulse generation circuit 21, and an L-side drive circuit 102A includes a pulse generation circuit 22. The pulse generation circuit 21 receives the input signal SI1, generates a pulse signal that is at low level for a predetermined time period from the timing of a transition of the input signal SI1 from high level to low level, and outputs the pulse signal. The pulse generation circuit 21 includes, for example, a delay 211 that delays the input signal SI1, an inverter 212 that inverts the output of the delay 211, and an OR gate 213 that receives the output of the inverter 212 (node 4) and the signal at the node 1 as its inputs. The output of the OR gate 213 (node 5) is to be the output of the pulse generation circuit 21. Likewise, the pulse generation circuit 22 receives the input signal SI2, generates a pulse signal that is at high level for a predetermined time period from the timing of a transition of the input signal SI2 from low level to high level, and outputs the pulse signal. The pulse generation circuit 22 includes, for example, a delay 221 that delays the input signal SI2, an inverter 222 that inverts the output of the delay 221, and an AND gate 223 that receives the output of the inverter 222 (node 14) and the signal at the node 11 as its inputs. The output of the AND gate 223 (node 15) is to be the output of the pulse generation circuit 22. Note that the configurations of the pulse generation circuits 21 and 22 are not limited to those described above.

The n-type transistor N3 receives the output of the pulse generation circuit 21 at its gate. That is, in this embodiment, the pulse signal output from the pulse generation circuit 21 is equivalent to the signal corresponding to the input signal SI1. The n-type transistor N3 is OFF only for the time period when the pulse signal output from the pulse generation circuit 21 is at low level. Likewise, The p-type transistor P3 receives the output of the pulse generation circuit 22 at its gate. That is, in this embodiment, the pulse signal output from the pulse generation circuit 22 is equivalent to the signal corresponding to the input signal SI2. The p-type transistor P3 is OFF only for the time period when the pulse signal output from the pulse generation circuit 22 is at high level.

Figure 5A:
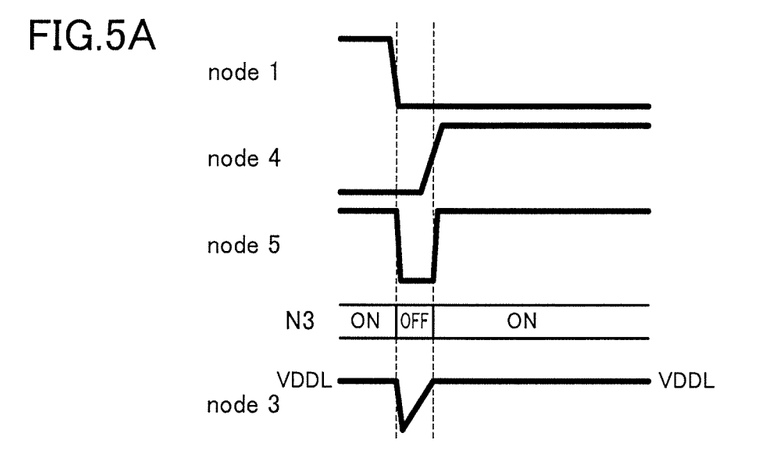
FIGS. 5A and 5B are waveform charts showing the operation of the output circuit of FIG. 4.
Figure 5B:
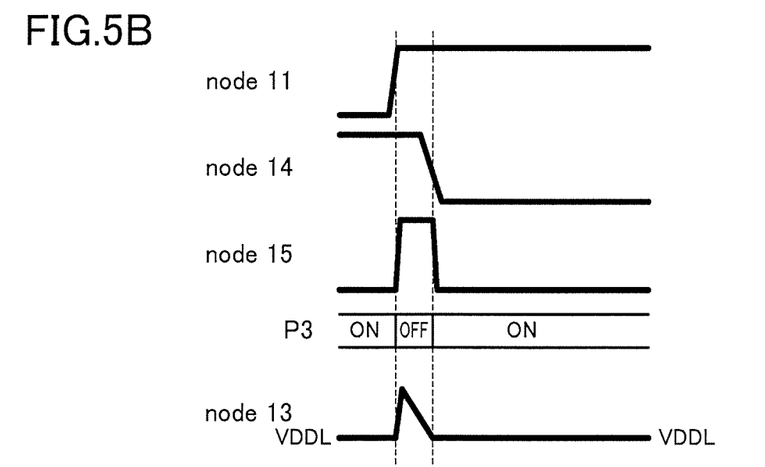

FIGS. 5A and 5B are waveform charts showing the characteristics of the operation of the output circuit 100A of FIG. 4, where FIG. 5A shows the case of a transition of the output signal PAD from low level to high level and FIG. 5B shows the case of a transition of the output signal PAD from high level to low level. As shown in FIG. 5A, in the case of a transition of the output signal PAD from low level to high level, the input signal SI1 makes a transition from high level to low level, and the potential of the node 1 also makes a transition from high level to low level. The potential of the node 4 in the pulse generation circuit 21 makes a transition from low level to high level lagging behind the transition of the node 1. Thus, the output of the pulse generation circuit 21 (node 5) is at low level for a predetermined time period and then goes to high level. Accordingly, the n-type transistor N3 is OFF for a predetermined time period and then becomes ON. The potential of the node 3 returns to VDDL and becomes stable.

Similarly, as shown in FIG. 5B, in the case of a transition of the output signal PAD from high level to low level, the input signal SI2 makes a transition from low level to high level, and the potential of the node 11 also makes a transition from low level to high level. The potential of the node 14 in the pulse generation circuit 22 makes a transition from high level to low level lagging behind the transition of the node 11. Thus, the output of the pulse generation circuit 22 (node 15) is at high level for a predetermined time period and then goes to low level. Accordingly, the p-type transistor P3 is OFF for a predetermined time period and then becomes ON. The potential of the node 13 returns to VDDL and becomes stable.

That is, in the H-side drive circuit 101A, the n-type transistor N3 is made OFF only for a time period when potential change at the node 3 due to the coupling by the capacitor C1 is expected. Likewise, in the L-side drive circuit 102A, the p-type transistor P3 is made OFF only for a time period when potential change at the node 13 due to the coupling by the capacitor C2 is expected. Therefore, according to this embodiment, in addition to the advantages described in the first embodiment, an advantage of being capable of stabilizing the static state of the output signal PAD is obtained.

Third Embodiment

Figure 6:
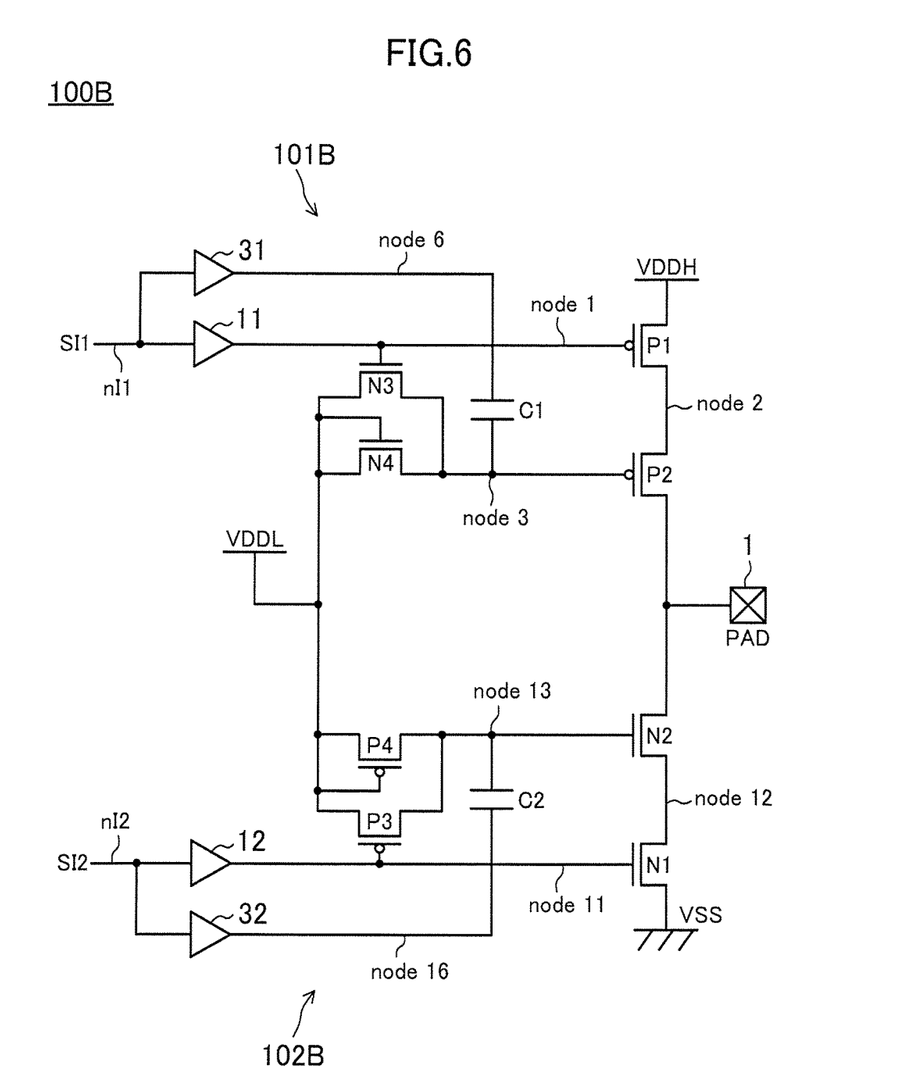
FIG. 6 is a circuit configuration diagram of an output circuit according to the third embodiment.

FIG. 6 is a circuit configuration diagram of an output circuit according to the third embodiment. An output circuit 100B of FIG. 6 has a configuration roughly similar to that of the output circuit 100 of FIG. 1, and thus detailed description on the components already described is omitted here.

In the first embodiment, one terminal of the capacitor C1 is connected to the gate of the p-type transistor P1, and one terminal of the capacitor C2 is connected to the gate of the n-type transistor N1. In this embodiment, the input signal SI1 is fed to one terminal of the capacitor C1 via a route that is not connected to the gate of the p-type transistor P1, and the input signal SI2 is fed to one terminal of the capacitor C2 via a route that is not connected to the gate of the n-type transistor N1.

In the output circuit 100B of FIG. 6, an H-side drive circuit 101B includes a buffer circuit 31 that receives the input signal SI1, separately from the first buffer circuit 11, and an L-side drive circuit 102B includes a buffer circuit 32 that receives the input signal SI2, separately from the second buffer circuit 12. The buffer circuit 31 permits the input signal SI1 to propagate through a signal route (node 6) different from the node 1 connected to the gate of the p-type transistor P1. Likewise, the buffer circuit 32 permits the input signal SI2 to propagate through a signal route (node 16) different from the node 11 connected to the gate of the n-type transistor N1.

The capacitor C1 is connected between the node 6 and the node 3. That is, one terminal of the capacitor C1 is connected to the node 6 that is not connected to the gate of the p-type transistor P1, not to the node 1 connected to the gate of the p-type transistor P1. Likewise, the capacitor C2 is connected between the node 16 and the node 13. That is, one terminal of the capacitor C2 is connected to the node 16 that is not connected to the gate of the n-type transistor N1, not to the node 11 connected to the gate of the n-type transistor N1.

Figure 7A:
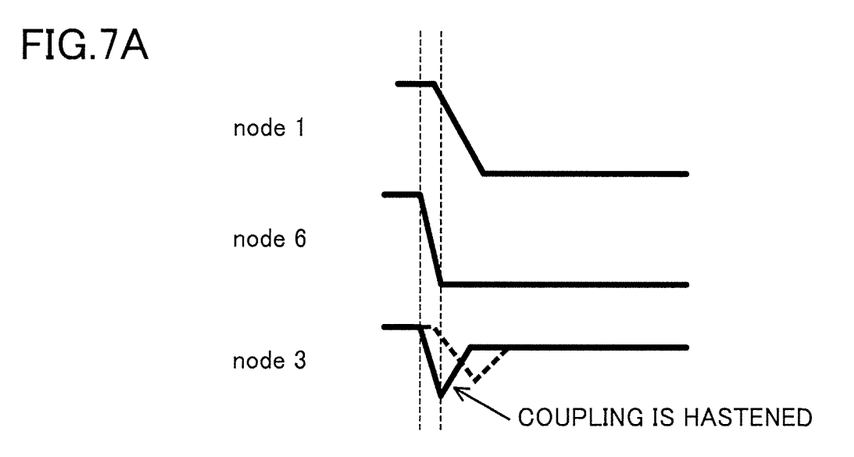
FIGS. 7A and 7B are waveform charts showing the operation of the output circuit of FIG. 6.
Figure 7B:
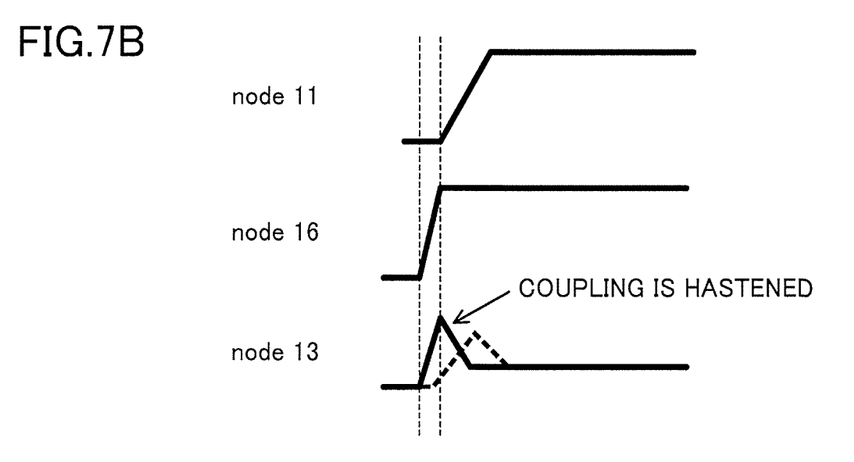

FIGS. 7A and 7B are waveform charts showing the characteristics of the operation of the output circuit 100B of FIG. 6, where FIG. 7A shows the case of a transition of the output signal PAD from low level to high level and FIG. 7B shows the case of a transition of the output signal PAD from high level to low level. In FIGS. 7A and 7B, the solid lines represent potential changes in this embodiment, and the dashed lines represent potential changes in the first embodiment.

As shown in FIG. 7A, in the case of a transition of the output signal PAD from low level to high level, the input signal SI1 makes a transition from high level to low level, and the signal at the node 1 also makes a transition from high level to low level. The signal at the node 1 however has a possibility of causing lagging of the timing and blunting of waveforms due to increases in the number of steps of buffers and in wiring load, for example. By contrast, the input signal SI1 swiftly propagates through the node 6. Therefore, by connecting one terminal of the capacitor C1 to the node 6, the timing of occurrence of the coupling by the capacitor C1 can be hastened.

Similarly, as shown in FIG. 7B, in the case of a transition of the output signal PAD from high level to low level, the input signal SI2 makes a transition from low level to high level, and the signal at the node 11 also makes a transition from low level to high level. The signal at the node 11 however has a possibility of causing lagging of the timing and blunting of waveforms due to increases in the number of steps of buffers and in wiring load, for example. By contrast, the input signal S12 swiftly propagates through the node 16. Therefore, by connecting one terminal of the capacitor C2 to the node 16, the timing of occurrence of the coupling by the capacitor C2 can be hastened.

Thus, according to this embodiment, in addition to the advantages described in the first embodiment, the transitions of the output signal PAD can be further sped up.

Figure 8:
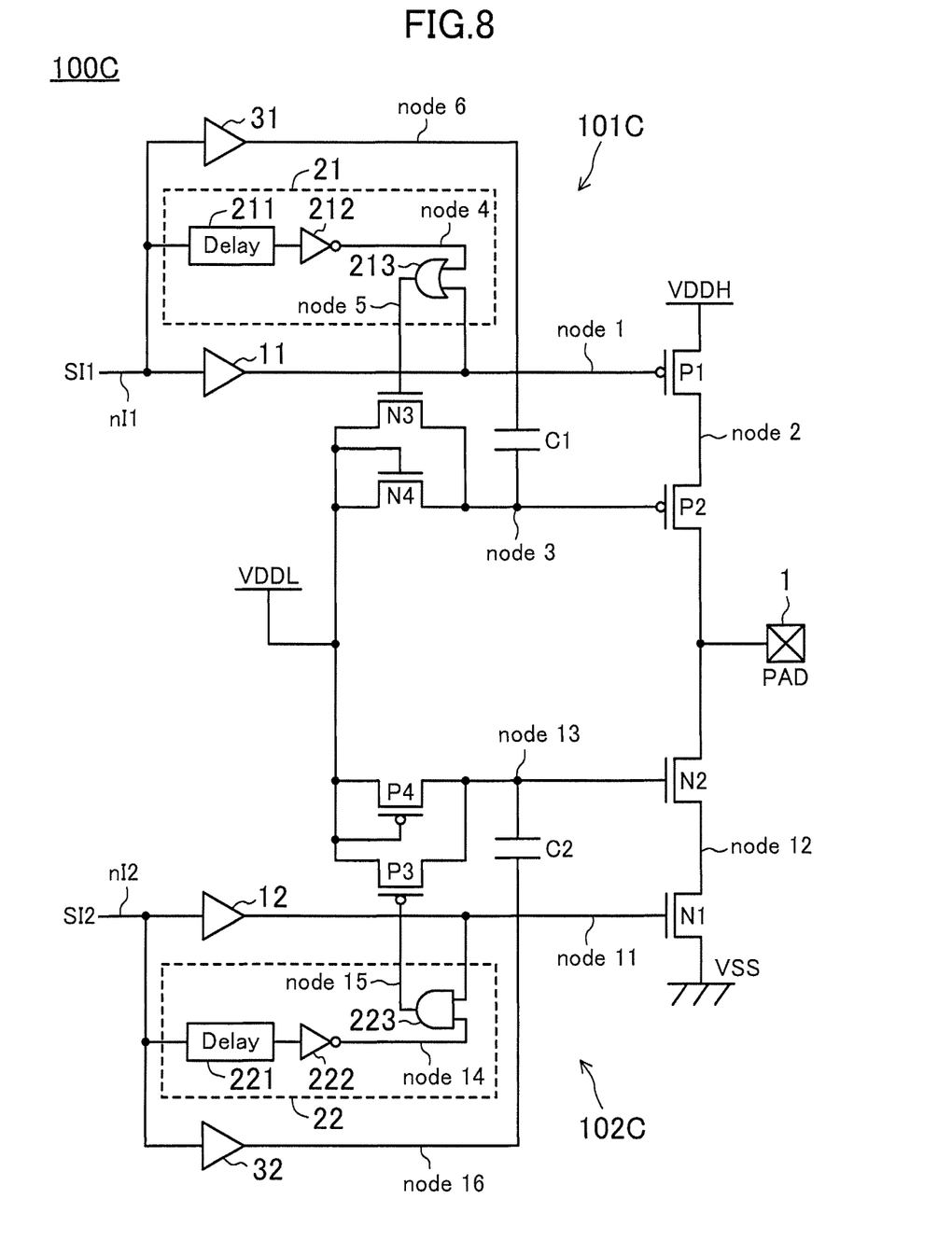
FIG. 8 is a circuit configuration diagram of an output circuit obtained by combining the second embodiment and the third embodiment.

The second embodiment and the third embodiment may be combined to implement an output circuit. FIG. 8 is a circuit configuration diagram of an output circuit implemented by combining the second embodiment and the third embodiment. In an output circuit 100C of FIG. 8, an H-side drive circuit 101C includes the pulse generation circuit 21 and the buffer circuit 31. The n-type transistor N3 receives the output of the pulse generation circuit 21 at its gate. Also, one terminal of the capacitor C1 is connected to the node 6. Likewise, an L-side drive circuit 102C includes the pulse generation circuit 22 and the buffer circuit 32. The p-type transistor P3 receives the output of the pulse generation circuit 22 at its gate. Also, one terminal of the capacitor C2 is connected to the node 16. The output circuit 100C of FIG. 8 can obtain the advantages described in the second and third embodiments.

Fourth Embodiment

Figure 9:
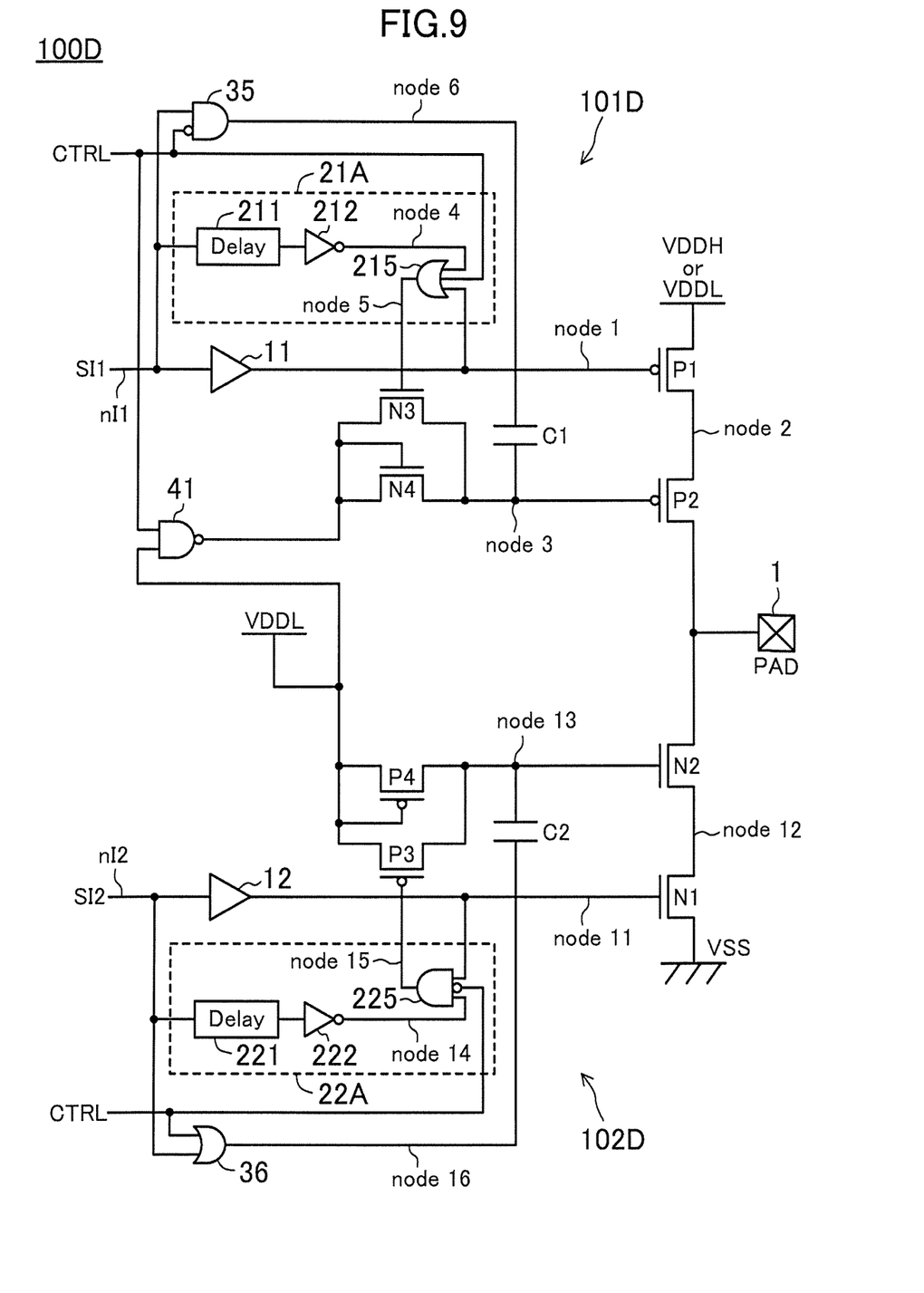
FIG. 9 is a circuit configuration diagram of an output circuit according to the fourth embodiment.

FIG. 9 is a circuit configuration diagram of an output circuit according to the fourth embodiment. An output circuit 100D of FIG. 9 has a configuration roughly similar to that of the output circuit 100C of FIG. 8, and thus detailed description on the components already described is omitted here.

The output circuit 100D of FIG. 9 is configured so that the operating voltage is switchable with a control signal CTRL. It is herein assumed that the output circuit 100D operates with VDDH when the control signal CTRL is "0" (low level) and operates with VDDL when it is "1" (high level).

An H-side drive circuit 101D includes a pulse generation circuit 21A in place of the pulse generation circuit 21. The pulse generation circuit 21A includes a 3-input OR gate 215 in place of the OR gate 213. The 3-input OR gate 215 receives the control signal CTRL in addition to the output of the inverter 212 (node 4) and the signal at the node 1 as the inputs. Also, the H-side drive circuit 101D includes an AND gate 35 in place of the buffer circuit 31. The AND gate 35 receives the input signal SU and an inverted signal of the control signal CTRL as the inputs.

Likewise, an L-side drive circuit 102D includes a pulse generation circuit 22A in place of the pulse generation circuit 22. The pulse generation circuit 22A includes a 3-input AND gate 225 in place of the AND gate 223. The 3-input AND gate 225 receives the inverted signal of the control signal CTRL in addition to the output of the inverter 222 (node 14) and the signal at the node 11 as the inputs. Also, the L-side drive circuit 102D includes an OR gate 36 in place of the buffer circuit 32. The OR gate 36 receives the input signal SI2 and the control signal CTRL as the inputs.

The output circuit 100D also includes a NAND gate 41. The NAND gate 41 receives the control signal CTRL and VDDL as the inputs, and the output thereof is connected to the drains of the n-type transistors N3 and N4.

When the control signal CTRL is "0," the operating voltage is VDDH. At this time, the output circuit 100D operates similarly to the circuit of FIG. 8. That is, the pulse generation circuit 21A operates similarly to the pulse generation circuit 21 in FIG. 8, and the pulse generation circuit 22A operates similarly to the pulse generation circuit 22 in FIG. 8. The input signal SI1 is allowed to propagate through the node 6, and the input signal SI2 is allowed to propagate through the node 16.

When the control signal CTRL is "1," the operating voltage is VDDL. At this time, the output of the pulse generation circuit 21A, i.e., the potential of the node 5 is fixed to high level, and thus the n-type transistor N3 is kept ON. Likewise, the output of the pulse generation circuit 22A, i.e., the potential of the node 15 is fixed to low level, and thus the p-type transistor P3 is kept ON. Also, the potential of the node 6 is fixed to low level, so that the coupling by the capacitor C1 does not function. Likewise, the potential of the node 16 is fixed to high level, so that the coupling by the capacitor C2 does not function. As a result, the potential of the node 3 is fixed to VSS, and the potential of the node 13 is fixed to VDDL.

As described above, according to this embodiment, the operating voltage of the output circuit 100D can be switched between VDDL and VDDH with the control signal CTRL. When the circuit operates with VDDH, it can operate similarly to the configuration of FIG. 8.

Fifth Embodiment

Figure 10:
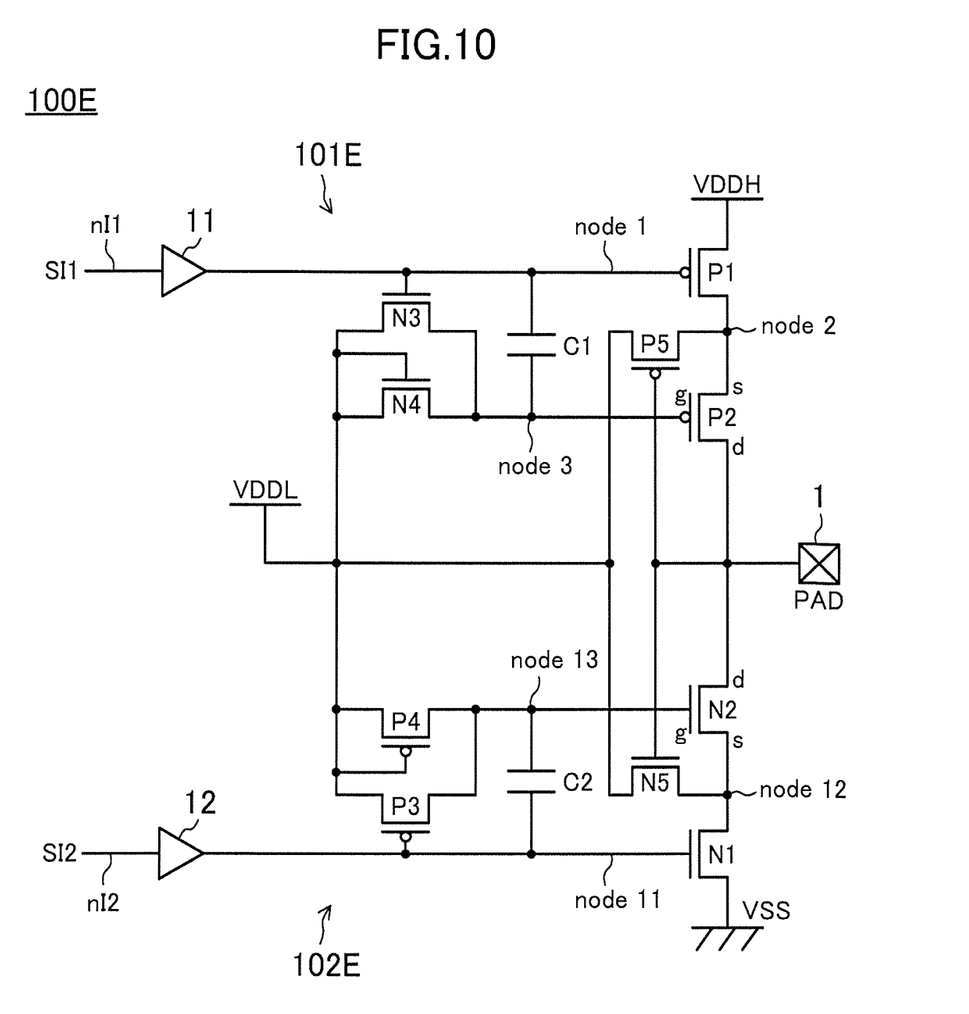
FIG. 10 is a circuit configuration diagram of an output circuit according to the fifth embodiment.

FIG. 10 is a circuit configuration diagram of an output circuit according to the fifth embodiment. An output circuit 100E of FIG. 10 has a configuration roughly similar to that of the output circuit 100 of FIG. 1, and thus detailed description on the components already described is omitted here.

In the output circuit 100E of FIG. 10, an H-side drive circuit 101E includes a p-type transistor P5, and an L-side drive circuit 102E includes an n-type transistor N5. The p-type transistor P5 has a source connected to the node 2, a drain connected to the second power supply VDDL, and a gate connected to the output terminal 1. The n-type transistor N5 has a source connected to the node 12, a drain connected to the second power supply VDDL, and a gate connected to the output terminal 1.

When the output signal PAD is at low level, the p-type transistor P5 is ON, whereby the potential of the node 2 is fixed to VDDL. Because of this, even when the voltage of the output signal PAD fluctuates suddenly, the source-drain voltage Vds of the p-type transistor P2 can be prevented from rising. Likewise, when the output signal PAD is at high level, the n-type transistor N5 is ON, whereby the potential of the node 12 is fixed to VDDL. Because of this, even when the voltage of the output signal PAD fluctuates suddenly, the source-drain voltage Vds of the n-type transistor N2 can be prevented from rising. Thus, degradation or damage of the p-type transistor P2 and the n-type transistor N2 can be prevented.

This embodiment may also be applied to a circuit configuration other than that shown in the first embodiment.

While preferred embodiments of the present disclosure have been described, it is to be understood that the present disclosure is not limited to such embodiments, but various modifications may be made by a person with an ordinary skill in the art within the scope of the technical ideas of the disclosure. It should also be noted that any constituents of the embodiments may be combined arbitrarily without departing from the spirit of the present disclosure.

The output circuits according to the present disclosure, which can prevent occurrence of degradation or damage of transistors, are useful for improvement of the durability of LSIs, for example.

What is claimed is:

1. An output circuit configured to receive a data input signal and output an output signal that makes a transition between a ground potential and a first potential in response to the data input signal, comprising:
    an output terminal configured to output the output signal;
    an input node configured to receive an input signal that changes in response to the data input signal and is smaller in amplitude than the output signal;
    a first p-type transistor having a source connected to a first power supply that feeds the first potential and a gate to which the input signal is fed;
    a second p-type transistor having a source connected to a drain of the first p-type transistor, a drain connected to the output terminal, and a gate connected to a first node;
    a capacitor having one terminal to which the input signal is fed and the other terminal connected to the first node;
    a first n-type transistor having a source connected to a second power supply that feeds a second potential lower than the first potential and a drain connected to the first node;
    a second n-type transistor having a source and a gate both connected to the second power supply and a drain connected to the first node, and
    a pulse generation circuit configured to receive the input signal, generate a pulse signal that is at low level for a predetermined time period from a timing of the first transition of the input signal, and output the pulse signal,
    wherein
    the first n-type transistor has a gate to which a signal corresponding to the input signal is fed, and is controlled to be ON when the input signal is at high level and OFF for at least a predetermined time period when the input signal makes a first transition that is a transition from high level to low level, and
    the gate of the first n-type transistor is connected to an output of the pulse generation circuit.

2. An output circuit configured to receive a data input signal and output an output signal that makes a transition between a ground potential and a first potential in response to the data input signal, comprising:
    an output terminal configured to output the output signal;
    an input node configured to receive an input signal that changes in response to the data input signal and is smaller in amplitude than the output signal;
    a first p-type transistor having a source connected to a first power supply that feeds the first potential and a gate to which the input signal is fed;
    a second p-type transistor having a source connected to a drain of the first p-type transistor, a drain connected to the output terminal, and a gate connected to a first node;
    a capacitor having one terminal to which the input signal is fed and the other terminal connected to the first node;
    a first n-type transistor having a source connected to a second power supply that feeds a second potential lower than the first potential and a drain connected to the first node; and
    a second n-type transistor having a source and a gate both connected to the second power supply and a drain connected to the first node,
    wherein
    the first n-type transistor has a gate to which a signal corresponding to the input signal is fed, and is controlled to be ON when the input signal is at high level and OFF for at least a predetermined time period when the input signal makes a first transition that is a transition from high level to low level, and
    the one terminal of the capacitor is connected to a second node that is connected to the input node and is not connected to the gate of the first p-type transistor.

3. An output circuit configured to receive a data input signal and output an output signal that makes a transition between a ground potential and a first potential in response to the data input signal, comprising:
    an output terminal configured to output the output signal;
    an input node configured to receive an input signal that changes in response to the data input signal and is smaller in amplitude than the output signal;
    a first n-type transistor having a source connected to a ground power supply and a gate to which the input signal is fed;

a second n-type transistor having a source connected to a drain of the first n-type transistor, a drain connected to the output terminal, and a gate connected to a first node;

a capacitor having one terminal to which the input signal is fed and the other terminal connected to the first node, a first p-type transistor having a source connected to a second power supply that feeds a second potential lower than the first potential and a drain connected to the first node;

a second p-type transistor having a source and a gate both connected to the second power supply and a drain connected to the first node, and a pulse generation circuit configured to receive the input signal, generate a pulse signal that is at high level for a predetermined time period from a timing of the first transition of the input signal, and output the pulse signal, wherein the first p-type transistor has a gate to which a signal corresponding to the input signal is fed, and is controlled to be ON when the input signal is at low level and OFF for at least a predetermined time period when the input signal makes a first transition that is a transition from low level to high level, and the gate of the first p-type transistor is connected to an output of the pulse generation circuit.

4. An output circuit configured to receive a data input signal and output an output signal that makes a transition between a ground potential and a first potential in response to the data input signal, comprising:

an output terminal configured to output the output signal;

an input node configured to receive an input signal that changes in response to the data input signal and is smaller in amplitude than the output signal;

a first n-type transistor having a source connected to a ground power supply and a gate to which the input signal is fed;

a second n-type transistor having a source connected to a drain of the first n-type transistor, a drain connected to the output terminal, and a gate connected to a first node;

a capacitor having one terminal to which the input signal is fed and the other terminal connected to the first node, a first p-type transistor having a source connected to a second power supply that feeds a second potential lower than the first potential and a drain connected to the first node; and a second p-type transistor having a source and a gate both connected to the second power supply and a drain connected to the first node, wherein the first p-type transistor has a gate to which a signal corresponding to the input signal is fed, and is controlled to be ON when the input signal is at low level and OFF for at least a predetermined time period when the input signal makes a first transition that is a transition from low level to high level, and the one terminal of the capacitor is connected to a second node that is connected to the input node and is not connected to the gate of the first n-type transistor.

* * * * *